United States Patent [19]

Cline

[11] Patent Number: 4,515,654
[45] Date of Patent: May 7, 1985

[54] METHOD FOR MAKING SEMICONDUCTOR DEVICES UTILIZING EUTECTIC MASKS

[75] Inventor: Harvey E. Cline, Schenectady, N.Y.

[73] Assignee: General Electric Company, Schenectady, N.Y.

[21] Appl. No.: 614,173

[22] Filed: May 25, 1984

Related U.S. Application Data

[62] Division of Ser. No. 395,761, Jul. 6, 1982.

[51] Int. Cl.$^3$ ............... C23F 1/02; H01L 7/44; B44C 1/22; C03C 15/00
[52] U.S. Cl. ............... 156/656; 148/187; 156/653; 156/657; 156/904; 156/659.1; 156/628; 427/85
[58] Field of Search ............... 156/656, 659.1, 653, 156/657, 904, 628; 148/1.5, 187; 427/85; 357/71

[56] References Cited

U.S. PATENT DOCUMENTS 3,698,078 10/1972 Redington ............... 156/662 X
4,108,715 8/1978 Ishikawa et al. ............... 156/628

Primary Examiner—William A. Powell
Attorney, Agent, or Firm—Paul E. Rochford; James C. Davis, Jr.; James Magee, Jr.

[57] ABSTRACT

A method is described for making self-aligned doped regions in a body of semiconductor material by means of an in situ eutectic mask formed by the selective removal of one of the phases of a metallic eutectic solidified as a thin film having a lamellar morphology. The elements of the in situ mask may also be utilized as metallic contact lines or interconnecting metallic stripes of a semiconductor device.

25 Claims, 14 Drawing Figures

METHOD FOR MAKING SEMICONDUCTOR DEVICES UTILIZING EUTECTIC MASKS

This application is a division of application Ser. No. 395,761, filed July 6, 1982.

CROSS-REFERENCE TO RELATED APPLICATIONS

The invention herein is related to the inventions disclosed and claimed in U.S. patent applications Ser. Nos. 245,764, 253,985 now U.S. Pat. No. 4,349,621, 320,995, now U.S. Pat. No. 4,477,324, Ser. No. 395,778, now U.S. Pat. No. 4,414,243; Ser. No. 382,878, now U.S. Pat. No. 4,461,070; which were filed Mar. 20, 1981, Apr. 13, 1981, Nov. 13, 1981, July 6, 1982 and May 28, 1982, respectively; all of which were filed in the name of the inventor of the invention herein, are assigned to the same assignee as the instant invention, and are herein incorporated by reference.

INTRODUCTION

This invention relates generally to semiconductor devices and, more particularly, to a method for making self-aligned doped regions in a body of semiconductor material by means of an in situ eutectic mask. The mask is formed by the selective removal of one of the phases of a metallic eutectic solidified as a thin film having a lamellar morphology. The in situ mask may be removed following its use to make the doped regions or may be left in place and utilized as highly desirable metallic contact lines, e.g., gates, or interconnecting metallic stripes of the semiconductor device.

BACKGROUND OF THE INVENTION

In the development of semiconductor devices, there is a constant and continuing effort to produce devices having improved performance characteristics such as increased operating frequencies (i.e., speeds), improved signal-to-noise ratios and decreased power requirements compared to predecessor devices, but which can be produced less expensively than predecessor devices. Higher device (component) densities, higher frequencies and data rate capabilities, reduced power requirements and multi-function capabilities on a single chip are being accomplished by the developing large-scale integration (LSI), very-large-scale integration (VLSI) and very-high-speed integrated circuit (VHSIC) technologies.

In the case of devices, increased performance characteristics can be obtained, for example, by decreasing parasitic capacitances, decreasing ohmic losses and decreasing transit times. Those improved performance characteristics can be accomplished, for example, by decreasing the width of source, gate and drain contact metallizations and the spacing between the contacts; increasing the conductivity of the metallizations; more sharply defining the doped areas; and/or by fabricating ohmic contacts having lower resistances.

Presently, interconnects and source, gate and drain contact metallizations of most semiconductor devices and chips are primarily made by conventional photolithographic, chemical etching and sputtering or ion implantation techniques. Photolithographic techniques are technically and economically capable of commercially producing metallizations, contact structures, and inter-contact spacings on the order of about one micron in width. In order to achieve sub-micron widths and thereby effect such desirable improvements as decreased size and increased operating frequencies, resort must generally be made to pioneering electron beam and X-ray lithographic techniques along with fine-line etching techniques such as plasma, reactive-ion, or ion-bombardment etching. At the present time, these pioneering techniques are slower and more expensive, especially in terms of capital equipment costs, than the more conventional lithographic techniques and do not necessarily eliminate such time consuming and troublesome steps as mask alignment steps.

Thus, there is a need for semiconductor devices and chips having near-micron and sub-micron sized component parts and features, e.g., metallizations, contact structures, and inter-contact spacings, and for methods by which those near-micron and sub-micron sized features can be produced reproducibly and inexpensively.

SUMMARY OF THE INVENTION

In accordance with the method of the present invention, it is possible to avoid in large measure the aforementioned limitations and drawbacks of the lithographic processes in the manufacture of semiconductor devices. More particularly, the present invention provides a method for inexpensively making self-aligned doped regions in bodies of semiconductor materials. The method of the invention also provides highly desirable metallic elements having micron and sub-micron width and interelement spacings which are useful a interconnects and contact lines and which were heretofore generally attainable only by means of slow and expensive electron-beam lithographic processes and the like. The metallic elements and doped regions are self-aligning, thus the expensive and time consuming alignment steps of conventional lithographic processes are largely eliminated. Further, in sharp contrast to present-day electron beam equipment operating in the direct writing mode, the speed of the process of the invention increases as the structures become finer.

Briefly and generally stated, the method of the invention includes the steps of: (1) providing a body of semiconductor material suitable for the manufacture of semiconductor devices; (2) forming a thin film lamellar metallic eutectic on at least a portion of a major planar surface of the body; (3) selectively removing one of the lamellar phases of the thin film lamellar metallic eutectic to form a spaced array of substantially parallel metallic lamellae or elements of the remaining phase with substantially parallel spaces in-between the elements, i.e., a mask, and to expose the segments of the major surface in-between the elements previously covered by the removed phase; and (4) forming at least first doped regions directly beneath the exposed segments of the major surface in-between the elements by introducing a first concentration of atoms of a first impurity type through the exposed segments of the major surface in-between the elements.

Suitable means for introducing the impurity (dopant) atoms include diffusion from gaseous and solid sources and ion implantation. A common consequence of ion implantation is damage (crystal lattice defects) to the host semiconductor material of the doped regions, thus a typical post-doping treatment is to heat the semiconductor body to a suitable temperature for a time sufficient to substantially anneal out (repair) the defects which is necessary to obtain the desired electrical characteristics. The annealing treatment may also be used to diffuse the localized doped regions to form extended doped regions at least portions of which lie beneath the elements of the mask on either side of what were originally the doped regions. In the case of diffusion from gaseous and solid impurity sources, the formation of extended doped regions will generally occur substantially simultaneously with the introduction of the dopant atoms.

The process may be repeated to form at least second doped regions by introducing a second concentration of a second impurity atom which may or may not be the same as the atoms of the first impurity type. Typically, these second doped regions would also be diffused to form second extended doped regions also underlying at least a portion of the elements of the mask and being bounded by the major surface and the previously formed extended doped regions.

The metallic elements of the mask may be removed at any time, but most typically will be left on to be utilized as metallic interconnects or metallic contact lines. In one typical device, a vertical power MOSFET, the thin film lamellar metallic eutectic is formed on an oxide layer on the surface of the body and, after further processing, forms the insulated gate structure of the device.

DETAILED DESCRIPTION OF THE INVENTION

Figure 1:
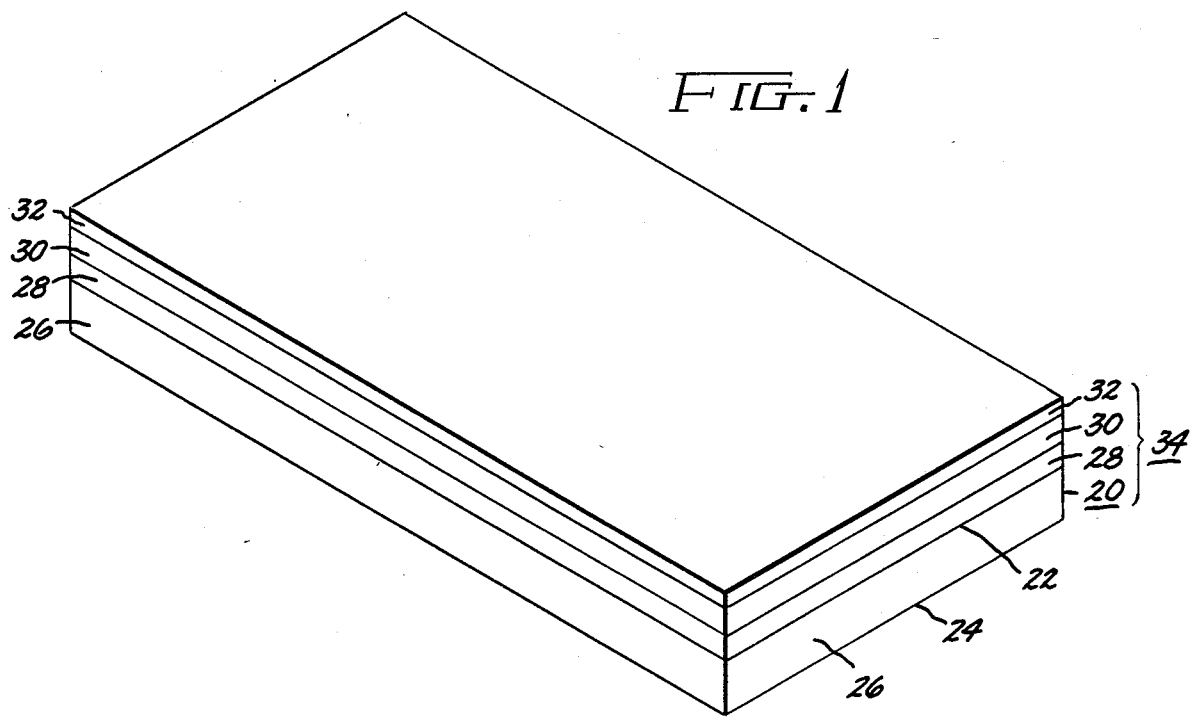
FIG. 1 is a schematic dimensional representation of a preform consisting of a body of semiconductor material suitable for the manufacture of semiconductor devices, two planar layers of the two components of a binary eutectic system overlying a major surface of the body and an optional cover layer overlying the eutectic components.

Reference is made to FIG. 1 wherein there is shown a body of semiconductor material 20 suitable for illustrating the basic innovative concept herein described of a method for producing self-aligned doped regions in a body of semiconductor material. Geometrically, body 20 may be described in terms of substantially parallel planar surfaces 22 or 24, i.e., top (or upper) and bottom (or lower) surfaces, respectively, for the orientation of body 20 shown in FIG. 1, and peripheral edge area 26 which interconnects surfaces 22 and 24. Peripheral edge area 26 may be of any convenient shape. The material of body 20 is a semiconductor, such as silicon, which is generally provided with excess atoms of an impurity (i.e., a dopant) to impart p-type or n-type conductivity to the semiconductor material. While body 20 has been described in its simplest yet functional form, it is not intended that the invention be limited by the above description as the invention is functional with other semiconductor bodies, such as non-homogeneously doped bodies, useful in the semiconductor arts for the making of semiconductor devices.

In the practice of the present invention, a eutectic alloy is next solidified as a thin film having a lamellar morphology on at least a portion of either major surface 22 or 24 as described below in brief, but functional, detail and in greater detail in the above cross-referenced and incorporated Ser. No. 245,764 application and the paper "Directionally Solidified Thin-Film Eutectic Alloys" by H. E. Cline (Journal of Applied Physics, 52 (1), pp. 256–260, January 1981) which is also incorporated herein by reference. The eutectic alloy selected is one which can be solidified to form a lamellar structure, i.e., one having alternating plate-like regions whose compositions correspond substantially to the phases of the eutectic system. Although the present invention is not limited to the use of binary eutectic systems, i.e., the inventive concept is equally applicable to ternary and higher order eutectics, typical suitable binary metallic systems include, for example, the lead-tin, lead-cadmium and aluminum-copper systems. Where subsequent device processing steps include processing at high temperatures, the refractory metal-based metallic eutectic systems such as the chromium-silicon and molybdenum-silicon systems are useable and desirable.

The thicknesses of the materials, i.e., components, of the eutectic alloy system are calculated per unit area of planar surface 22 or 24 as a ratio according to the following formula:

$$t_1\rho_1W_1 = t_2\rho_2W_2 = \ldots = t_n\rho_nW_n \quad (1)$$

where
  $W_1$ = weight percent of component 1 in the eutectic
  $W_n$ = weight percent of the $n^{th}$ component in the eutectic
  $\rho_1$ = density of component 1
  $\rho_n$ = density of the $n^{th}$ component
  $t_1$ = thickness of the layer of component 1
  $t_n$ = thickness of the layer of the $n^{th}$ component
and converted to actual thicknesses by use of the formula:

$$t_{film} = t_{total} = t_1 + t_2 + \ldots t_n \quad (2)$$

For a binary system, equation (1) reduces to $$\frac{t_1}{t_2} = \frac{\rho_2 W_1}{\rho_1(1-W_1)} \quad (3)$$

The calculational method shown above is more accurate than calculations from the phase diagram based on the so-called lever rule and is, therefore, preferred.

The starting materials should be as pure as possible, preferably "4–9s" or purer, as impurities tend to disrupt the heat and mass balance of the solidifying eutectic during the subsequent processing described below thereby forming defects, e.g., faults. Contamination of body 20 and the materials of the eutectic is to be avoided, thus the practice of clean room conditions, such as are known to those skilled in the art of the manufacture of semiconductor devices, is preferable.

The eutectic materials and body 20 are transferred to suitable apparatus (not shown) for the evaporation and deposition of the eutectic materials onto body 20. In a vacuum, preferably less than or equal to $10^{-6}$ Torr, the materials of the eutectic are evaporated and deposited sequentially in overlying planar layer-like fashion onto body 20. In FIG. 1 there is shown schematically layer 28 of a first component of a binary eutectic system deposited upon surface 22 of body 20 and layer 30 of the second component deposited upon layer 28. Preferably, the thickness of each layer is within ±10% of that calculated with Equations (1) and (2), although for some eutectic systems the acceptable tolerance may be less than ±10% in order to obtain the desired lamellar structure.

Optionally, cover layer 32, as shown in FIG. 1, may be provided on top of the deposited eutectic components. Cover layer 32 may be provided by depositing a refractory metal oxide subsequent to the deposition of the layers of the eutectic material or may be another piece of the same material as body 20 laid upon the deposited components. Cover layer 32 is desirable to prevent oxidation of the eutectic during subsequent processing. Oxidation may also be avoided by practicing the invention in a vacuum or inert atmosphere. With or without cover layer 32, a completed preform 34 has been fabricated at this stage.

Figure 2:
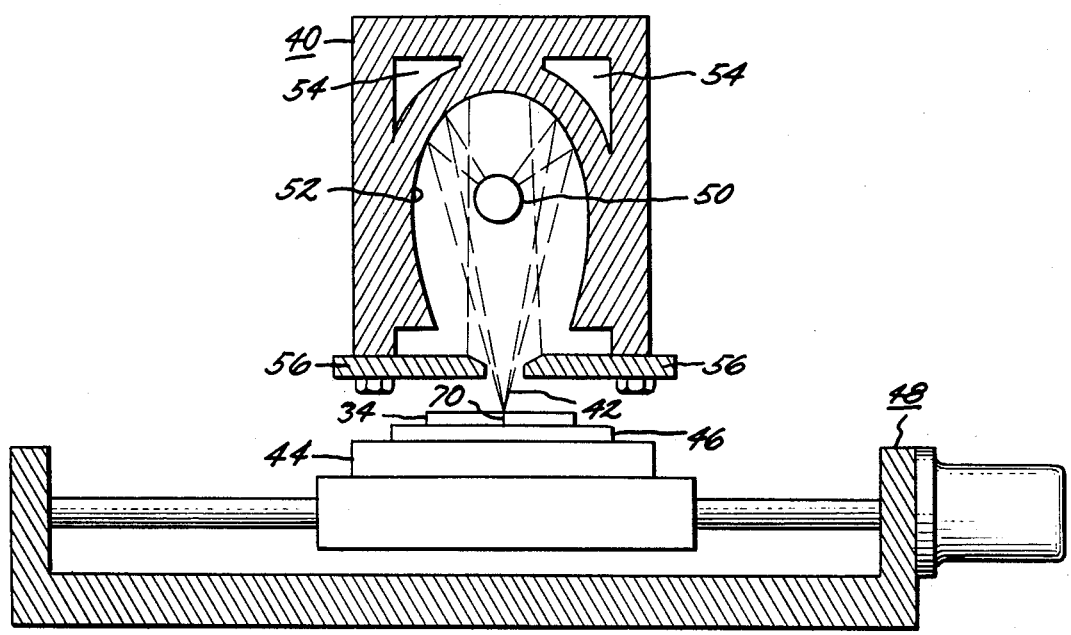
FIG. 2 is a schematic representation in cross-section of an apparatus, including a line heater, used to form a thin film eutectic on the body of FIG. 1.

The prepared eutectic preform 34 is next placed in an apparatus, such as that shown schematically in FIG. 2, for the next steps in the preparation of the eutectic thin film. Typically, the apparatus of FIG. 2 consists of heat source 40 capable of projecting beam of heat 42 onto preform 34, heat sink 44, which may be water cooled, optional thermal buffer plate 46 of a material such as quartz, and means 48 for smoothly translating heat sink 44 and preform 34 mounted thereon beneath beam 42 at a determinable rate. Sufficient heat is applied from heat source 40 to form narrow molten zone 70 of width W and longitudinal length L, as shown in FIG. 2 and in greater detail in FIGS. 3 and 4.

A line heater, such as that shown in FIG. 2, has been found to be an effective heat source 40 with suitable modifications including a line voltage regulator to minimize power fluctuations. One such line heater is that manufactured by Research, Inc. of Minneapolis, Minnesota (Catalogue #5215-10). The line heater of FIG. 2 consists primarily of lamp 50, such as a quartz-iodine or arc lamp, situated at the focal point of a polished aluminum elliptical reflector 52 which has cooling channels 54 therein. The commercial line heater was further modified by shutters 56 of highly polished aluminum which effectively intensify the thermal profile of beam 42 thus narrowing the width of zone 70 and thereby increasing the thermal gradient in zone 70.

A laser is also a suitable, although more expensive, heat source 40 than the line heater. The narrower molten zone 70 created by a laser makes possible both higher thermal gradients in molten zone 70 and more rapid solidification rates and, consequently, eutectic thin films having narrower lamellae and smaller interlamellar spacings. Replacement of the line heater with a laser as heat source 40 requires means for spreading the circular beam into a linear (line) heat source. The use of optics to slowly scan or raster the laser beam across preform 34 has been found to result in objectionable surface perturbations. A simple non-mechanical solution is to provide a cylindrical lens in the path of the laser beam between the laser as heat source 40 and preform 34 to convert the circular beam into a thin line source of heat. It was found, however, that the beam intensity was not uniform along the length of the line when the lens system was used, i.e., there was a decrease in power at the ends compared to the center of the line of heat.

The laser beam may be scanned rapidly enough through the use of a lens-mirror system, such as a rotating polygonal mirror, to create a satisfactory line source of heat. A further advantage of the use of a laser as heat source 40 is that preform 34 may be kept stationary and molten zone 70 traversed across preform 34 by the use of additional optical scanning means. By keeping preform 34 stationary, it is possible to minimize disruption of the eutectic structure by external mechanical vibrations. The use of the rotating polygonal mirror, however, adds to the overall cost of the system and requires that the optical system be kept in perfect alignment.

Figure 3:
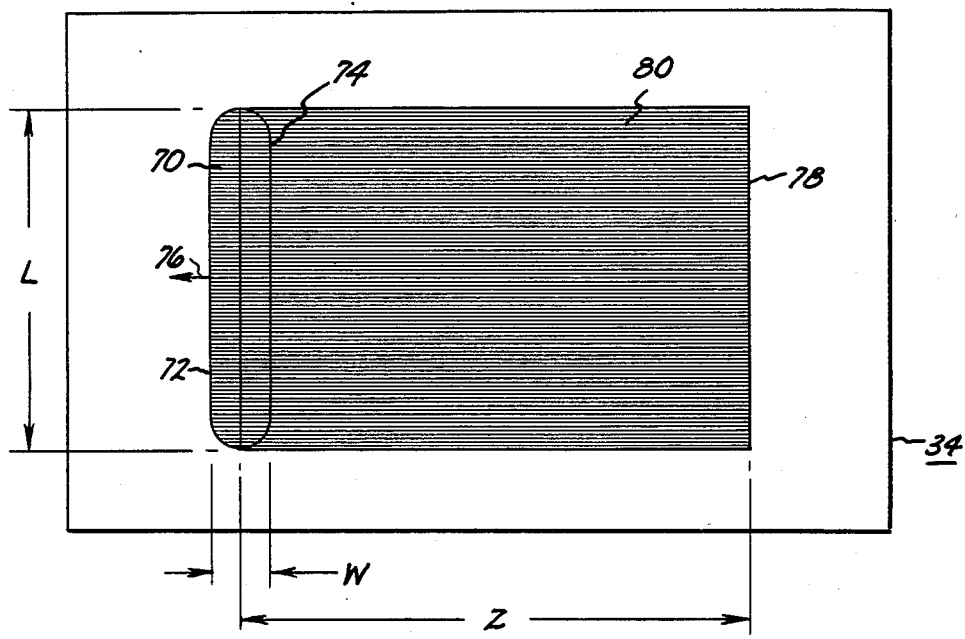
FIG. 3 is a schematic representation of the top surface of the preform of FIG. 1 partially converted to a thin film lamellar eutectic.
Figure 4:
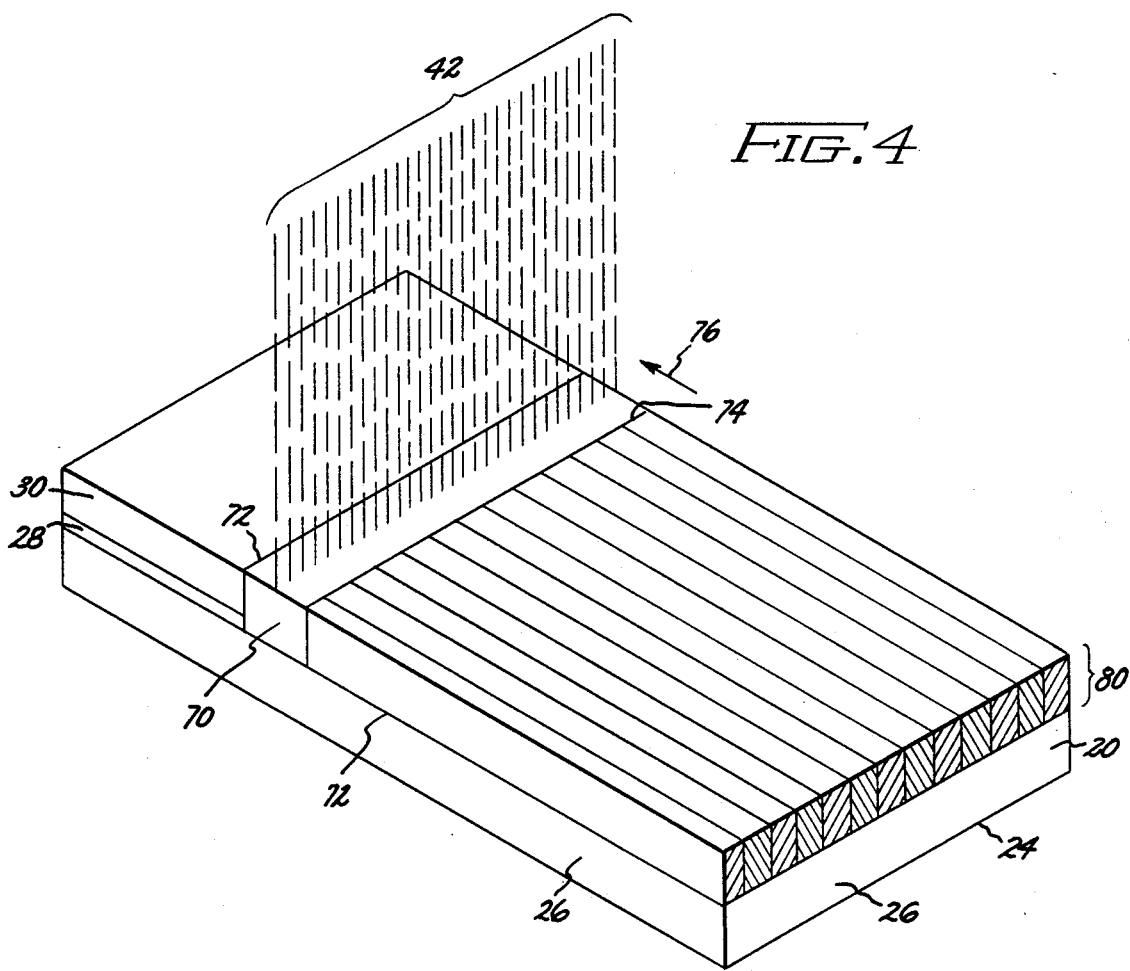
FIG. 4 is a dimensional view of the preform of FIG. 1 undergoing processing to form a thin film lamellar eutectic.

As shown in FIG. 4, molten zone 70 will be coextensive with and will rest on at least a portion of planar surface 22 (or 24) of body 20 and will otherwise be bounded by the unmelted eutectic material layers 28 and 30 and solidified thin film eutectic 80. By operating means 48, preform 34 is traversed beneath the stationary heat source thereby, in effect, moving molten zone 70 across preform 34. As molten zone 70 traverses preform 34, component layers 28 and 30 of the eutectic are melted at leading edge 72 of zone 70, mixed together in zone 70, and solidified at trailing edge 74 of zone 70 in the desired eutectic pattern 80. After the desired amount of material has been melted and solidified, the traversing motion of means 48 is stopped and heat source 40 is turned off whereupon molten zone 70 freezes in situ. In FIG. 3, molten zone 70 is shown after traversing a distance Z, in the direction of arrow 76 from starting location 78.

Figure 5:
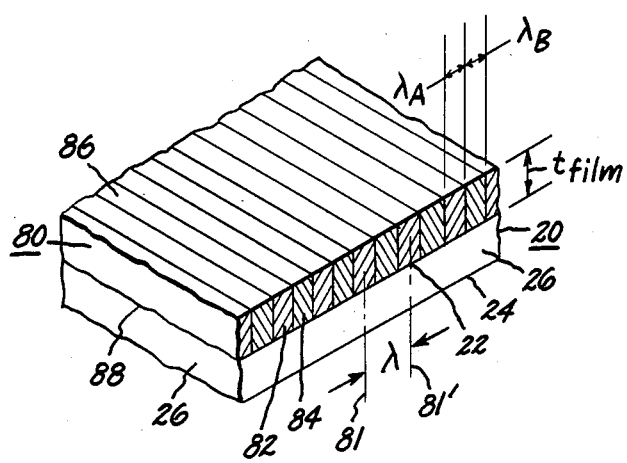
FIG. 5 is a schematic dimensional view in partial cross-section of a thin film lamellar eutectic situated on a major planar surface of a body.

FIG. 5 is a schematic cross-sectional representation of the structure of solidified eutectic 80 and is typical of the two phase thin film lamellar metallic eutectics made by the method described above. The interlamellar spacing, $\lambda$, defined as the distance between a reference point on one lamellae to the corresponding reference point on the nearest adjacent lamella of the same type, e.g., centerlines 81 and 81', is shown in FIG. 5 as are the widths $\lambda_A$ and $\lambda_B$ of lamellae 82 and 84, respectively. The lamellae extend between and terminate in the substantially parallel and generally planar top 86 and bottom 88 surfaces of thin film eutectic 80. Bottom surface 88 of thin film 80 will be coextensive with at least a portion of surface 22 of body 20 in this case. The center lines of the lamellae, e.g., centerlines 81 and 81', are substantially parallel to the film thickness dimension, i.e., the lamellae intersect top 86 and bottom 88 surfaces of the thin film at substantially right angles. The resultant film thickness, $t_{film}$, is measured as the perpendicular distance between surfaces 86 and 88 and is generally equal to the sum of the thicknesses of the component layers, e.g., layers 28 and 30. The interlamellar spacing, $\lambda$, and, consequently, the widths of the lamellae are principally a function of the growth, i.e., solidification, rate which generally follows the empirical relationship $$\lambda^2 V = \text{constant} \qquad (4)$$

where V equals the growth rate. Generally, the growth rate is equal to the rate at which molten zone 70 is traversed across preform 34.

Figure 6:
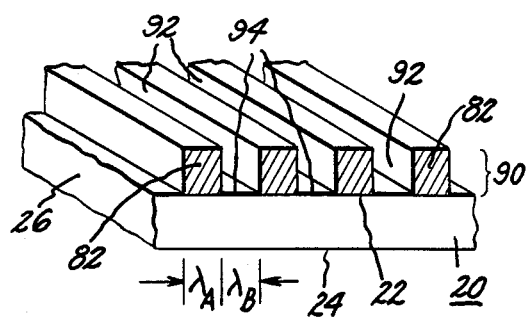
FIG. 6 is a schematic dimensional representation of the structure of FIG. 5 following selective removal of one of the phases to form a spaced array of metallic elements of the remaining phase.

Next, in accordance with the teachings of the above cross-referenced Ser. No. 320,995 application, one of the phases of the solidified thin film eutectic is selectively removed. Suitable means include chemical dissolution, electrochemical dissolution and reactive ion etching (plasma etching). As shown in FIG. 6, the product of this step is spaced array 90 of substantially parallel lamellae or elements 82 of the remaining phase with substantially parallel spaces 92 in-between lamellae 82. Substantially parallel spaces 92 expose surfaces 94, i.e., segments of surface 22, of semiconductor body 20. A particularly desirable feature of array 90 is that the width of lamellae 82 ($\lambda_A$) and the spacing ($\lambda_B$) of spaces in-between lamellae 82 can readily be achieved at near-micron and sub-micron levels without resort to the slow and expensive prior art electron beam and X-ray lithographic processes required to otherwise produce such structures as array 90. In the case of a ternary eutectic, for example, where one phase is removed selectively, the "remaining lamellae 82" would be a coupled pair of the two phases not removed.

Figure 7:
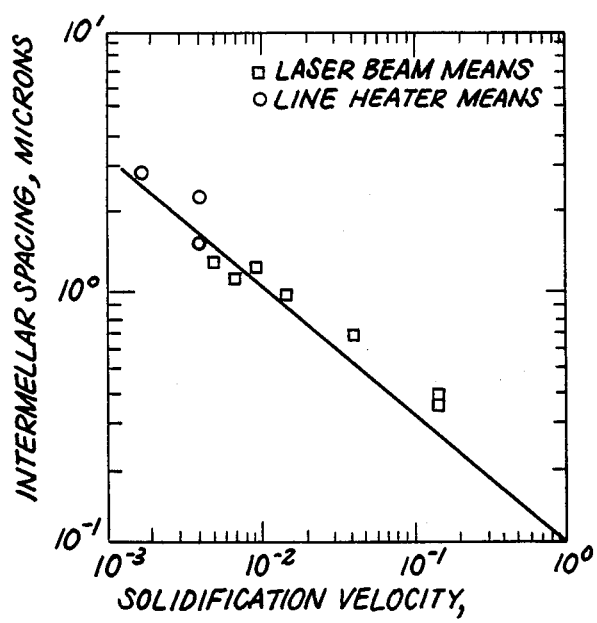
FIG. 7 is a graph of the interlamellar spacing of thin films of the Al-CuAl$_2$ eutectic system as a function of solidification velocity.

FIG. 7 shows data of interlamellar spacing as a function of the solidification velocity for several preforms of the Al-CuAl$_2$ eutectic alloy system (33.2 wt. % Cu) solidified on a Pyrex ® substrate using line heater and laser beam means. The preforms were made by depositing layers of Cu and Al on the Pyrex ® substrate with an electron beam evaporator in a vacuum of $10^{-6}$ Torr at a rate of 20 Angstroms/sec. During evaporation, the thicknesses of the layers were monitored to give a 2580 Å thick copper layer and a 17420 Å thick aluminum layer. These thicknesses were calculated by equation (3) to give a 2 micron thick thin film of the eutectic composition.

The CuAl$_2$ phase ($\theta$) was selectively removed by electropolishing the films in a Disa Electropol Type 53 apparatus in a flowing solution of 62 ml perchloric acid, 137 ml water, 700 ml ethanol, and 100 ml butycellosolve. The electropolishing process was conducted at 35 volts direct current (DC) for 4 seconds at room temperature with the thin film as the anode and a stainless steel cathode of approximately the same surface area as the film situated opposite the thin film and separated by about 10 mm from the film.

The widths of the remaining lamellae of the aluminum-rich phase ($\alpha$) and spacing between the remaining lamellae were measured in a scanning electron microscope. Since the width of the $\alpha$-phase was essentially equal to the width of the $\theta$ phase, the remaining $\alpha$-phase lamellae were one-half of the interlamellar spacing plotted on FIG. 7. Thus, for the preform solidified at 0.0016 cm/sec having an interlamellar spacing of about 2.4 microns the width of the remaining lamellae of the $\alpha$-phase was about 1.2 microns. For the preform solidified at 0.14 cm/sec having an interlamellar spacing of about 0.33 micron the width of the remaining lamellae of the $\alpha$-phase was about 0.16 micron. In all cases, the height of the remaining lamellae was about 2 microns above surface 22. The data of FIG. 7 are described by the equation $$\lambda = B(V)^{-\frac{1}{2}} \qquad (5)$$

where the constant $B = 8.4 \times 10^{-6}$ cm$^{3/2}$sec$^{-\frac{1}{2}}$. The scatter in the interlamellar spacing is attributed to local fluctuations in the solidification velocity or in the constancy of the heat flow.

Transmission electron microscopy of the as-solidified eutectic thin films demonstrated that the interphase boundary between the Al-rich ($\alpha$) phase and the CuAl$_2$ ($\theta$) phase was planar and oriented normal to the plane of the film. Selective area electron diffraction was used to identify the phases and showed that the remaining lamellae were single crystals. Single crystals are advantageous for use in semiconductor device manufacture at submicron dimensions since single crystals exhibit minimal electromigration and improved thermal stability compared to polycrystals at the high temperatures which may be encountered in subsequent processing operations.

Using the same general procedure and equipment described above, a 5320 Å thick layer of cadmium and a 15,680 Å thick layer of lead were sequentially deposited on a Pyrex ® substrate in a vacuum of $10^{-6}$ Torr and directionally solidified at 0.0042 cm/sec.

The resultant lead-cadmium lamellar eutectic (17.4 wt. % Cd) thin film was electropolished using the pump from the Disa apparatus to pump a solution of 1% perchloric acid in methanol through a hypodermic syringe. The needle of the syringe, as the cathode, was traversed back and forth across a selected area of the anodic thin film at a distance of about 4 cm at a direct current potential of about 150 volts between the two. The structure was observed periodically through a microscope and the electropolishing was continued until the lamellae of the cadmium-rich phase were removed from between the lamellae of the lead-rich phase in the selected area. The result was a spaced array of lead-rich lamellae about 0.42 micron wide having an interlamellar spacing of about 0.57 micron. Alternatively, it has been found that dissolution of the lamellae of the cadmium-rich phase can be accomplished by simple immersion in a 1% solution of Nital (1 ml $HNO_3$ in 99 ml ethyl alcohol).

The next step in the method of the instant invention is to implant atoms of a first impurity type, i.e., a dopant, through surfaces 94 to form first doped regions 96 having a first concentration of the first impurity atoms in the semiconductor material of body 20. Suitable means for performing this step include ion bombardment (ion implantation) as is now practiced in the semiconductor arts. Alternatively, the impurity atoms may be introduced through surface 94 by diffusion from a gaseous or solid source. During this step, array 90 of lamellae (elements) 82 of the remaining phase serve, in effect, as a mask admitting the dopant atoms to desired regions 96 directly beneath surface segments 94 while shielding the remaining areas of surface 22 of semiconductor body 20.

At this stage, lamellae 82 or mask 90 may be removed leaving behind "self-aligned" regions 96. More typically, however, further processing will follow. If the impurity atoms were introduced by ion bombardment, semiconductor body 20, with or without mask 90, would typically be annealed at a sufficient temperature for a time sufficient to at least repair the crystal lattice damage in regions 96 which typically results from the ion bombardment process.

Figure 8:
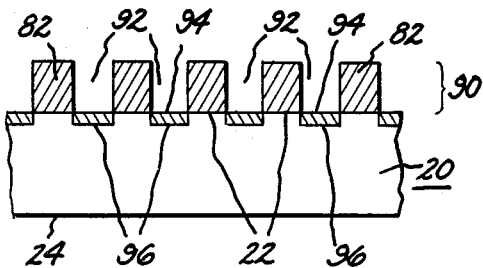
FIG. 8 is a schematic front view in cross-section of the spaced array of FIG. 6 following introduction of a first concentration of atoms of a first impurity type to form first doped regions.
Figure 9:
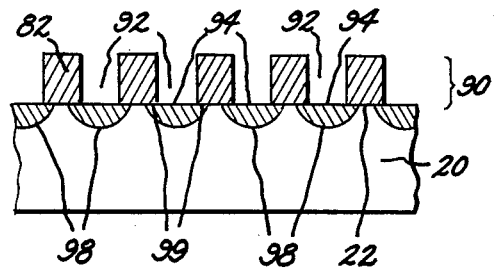
FIG. 9 shows schematically a front view in cross-section of the structure of FIG. 8 following a drive-in diffusion operation to form first extended doped regions.

Most typically, however, the structure of FIG. 8 would be subjected to a high temperature anneal (drive-in diffusion) to diffuse the impurity atoms in regions 96 to form first extended doped regions 98 as shown in FIG. 9. First extended doped regions 98 are located beneath surface 22 and extend to underlie at least a portion 99 of metallic elements 82 (or the projections thereof toward surface 24) situated on either side of what were first doped regions 96. In the case of diffusion from a gaseous or solid impurity source, regions 96 and 98 will frequently be formed substantially simultaneously. Normally, in semiconductor device construction, regions 96 and 98 will have at least a conductivity (inverse resistivity) different from the conductivity of the semiconductor material of host body 20 and may also have a different type conductivity, i.e., p-type as is derived from atoms of P, As and Sb in silicon or n-type as is derived from atoms of B, Al, Ga and In in silicon. If mask 90 is still in place, then the temperature at which the drive-in diffusion or the damage-repairing anneal is conducted must be below the melting point of the metallic phase of elements 82 of mask 90.

Figure 13:
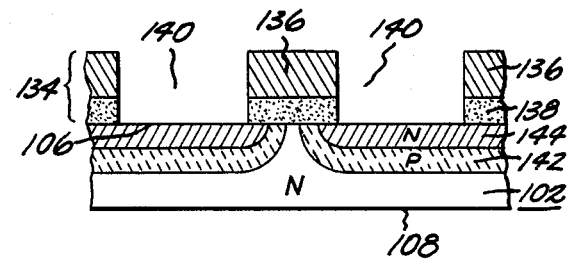
FIG. 13 is a schematic front view in cross-section of the structure of FIG. 12 following two sequential operations of introducing impurity atoms of a first and second type through the exposed segments of the top surface of the semiconductor base to form first and second doped regions followed by first and second drive-in diffusions to form first and second extended doped regions.

Those skilled in the semiconductor arts will appreciate that other variations of the above-described novel method for producing self-aligned doped regions in a body of semiconductor material are possible. Those skilled in the semiconductor arts will particularly appreciate that at least a second iteration of impurity atom introduction and diffusion may also be performed with array 90 in place to form active regions of semiconductor devices. Typically, the resultant structure will include second extended doped regions underlying at least a portion of the metallic elements on either side of surface segments 94 and which are bounded by major surface 22 and the first extended doped regions. A typical such structure is shown in FIG. 13 (regions 142 and 144). For the second iteration, the second impurity atoms may be the same as the first impurity atoms, in which case the concentrations of the atoms in the two regions would most likely be different, but most frequently the first and second atoms are selected to produce doped regions of opposite conductivity type.

Of further significant and novel advantage is the fact that lamellae 82 may be left in place after such implantation and diffusion operations to serve as passive circuit elements such as contacts and interconnecting wires. Thus, it will be appreciated that with lamellae 82 of array 90 acting as both a mask for the formation of active device areas and as passive circuit elements, semiconductor devices can now be produced which do not require the use of photomasking and chemical etching to define the device areas as is prevalent in prior art semiconductor device manufacturing methods. Since lamellae 82 are metallic, there will be the further advantage of high electrical conductivity which is not presently commonly attainable in prior art counterparts made from such materials as heavily doped polysilicon.

To illustrate the manner in which the above-described novel method would be used to manufacture semiconductor devices, the manufacture of a basic or elementary metal-oxide-semiconductor field-effect transistor (MOSFET), specifically a basic vertical power MOSFET, will now be described.

Figure 10:
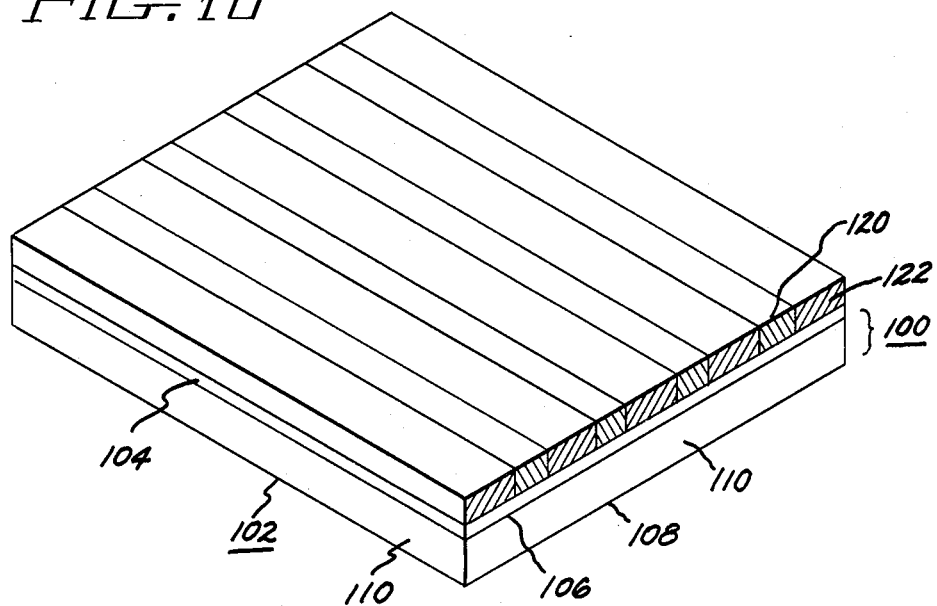
FIG. 10 is a schematic dimensional representation of an intermediate structure in the fabrication of a semiconductor device including a base of a semiconductor material suitable for the manufacture of semiconductor devices, a planar layer of an oxide of the semiconductor material overlying and contiguous with the top major planar surface of the base, and a two phase thin film lamellar metallic eutectic situated on the oxide layer.

Reference is now made to FIG. 10 wherein there is shown substrate 100 suitable for the manufacture of semiconductor devices. In simplest yet functional form, substrate 100 includes at least planar base 102 and planar layer 104 which overlies and is contiguous with at least a portion of either of substantially parallel major planar upper surface 106 or lower surface 108 of base 102. Peripheral edge area 110, which interconnects surfaces 106 and 108, may be of any convenient shape.

The material of base 102 is a semiconductor, such as silicon, which is provided with excess atoms of an impurity (i.e., a dopant) typically to impart n-type conductivity to the semiconductor material. Layer 104 is of a dielectric and insulating material which is deposited or otherwise provided. The presently preferred mode for providing layer 104 is to thermally grow an oxide of the semiconductor material of base 102, e.g., silicon dioxide ($SiO_2$) on silicon, by techniques familiar to those practicing the semiconductor device manufacturing arts. While substrate 100 has been described in its simplest yet functional form, it is not intended that the invention be limited by the above description as the invention is functional with other substrates and bases including non-homogeneously doped bases. A typical non-homogeneously doped body is one made of highly doped (i.e., concentrations greater than about $10^{19}$ atoms/$cm^3$), low-resistivity n-type (n+) silicon with a layer of lightly doped (i.e., concentrations less than about $10^{15}$ atoms/$cm^3$) n-type (n−) epitaxially grown silicon beneath layer 104.

Figure 11:
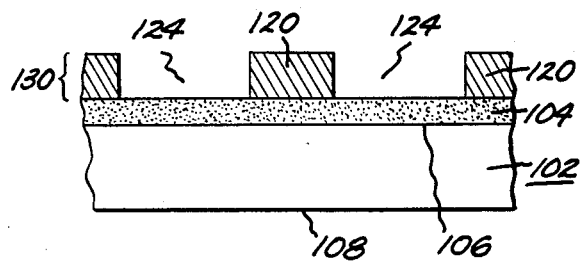
FIG. 11 is a schematic front view in cross-section of the structure of FIG. 10 following selective removal of one of the lamellar phases of the thin film eutectic to form an array of substantially parallel elements of the remaining phase.
Figure 12:
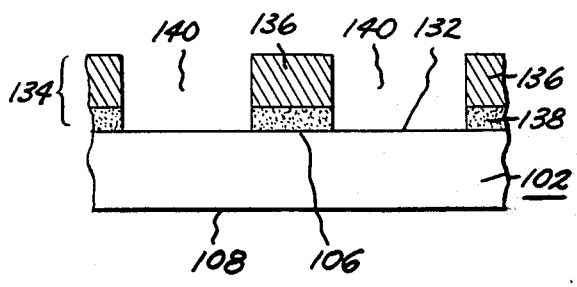
FIG. 12 is a schematic front view in cross-section of the structure of FIG. 11 following removal of the oxide layer from the spaces in-between the elements to expose segments of the upper surface of the semiconductor base and form the gates of the semiconductor device.

A binary eutectic alloy is next solidified as a thin film on planar layer 104 as described above to form the lamellar structure of alternating plates or lamellae 120 and 122 shown in FIG. 10. Then, using the techniques described above, one of the two types of lamellae is selectively removed leaving spaced array 130 of substantially parallel lamellae 120 of the remaining phase situated on oxide layer 104 with substantially parallel spaces 124 in-between lamellae 120 as shown in FIG. 11. Next the portions or segments of oxide layer 104 at the bottoms of spaces 124 exposed by the removed phase are also removed, preferably by dry etching techniques known to the practitioners of the semiconductor arts, to expose substantially rectangular segments of surface 106 of base 102, i.e., surface segments 132, to produce the structure of FIG. 12. Advantageously, spaced array 130 acts as a mask during this operation and may now be referred to as a spaced array of substantially parallel metal gate contacts 134, which include metallic elements 136 situated on layers of gate oxide 138, with substantially parallel spaces 140 in-between.

There next follows fabrication of first extended regions or wells 142, typically of p-type conductivity, and second extended or source regions 144, typically of n-type conductivity opposite to the conductivity type of regions 142. Both regions 142 and 144 underlie at least a portion of metal gate contacts 134 situated on either side of exposed surface segments 132 as shown in FIG. 13. Regions 142 and 144 may be made, for example, by two consecutive implantation and drive-in diffusion operations or by two consecutive diffusion doping operations from gaseous or solid state impurity sources. In either case, the impurity atoms are introduced through surfaces 132 with metal gate contacts 134 again advantageously acting as a self-aligned, in situ mask without the need for the photomasking and chemical etching steps which would normally be required to build the structure of FIG. 13 by prior art methods.

Figure 14:
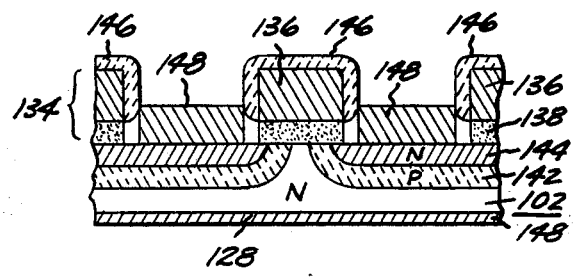
FIG. 14 is a schematic front view in cross-section of the structure of FIG. 13 following addition of source and drain contacts to form a representative semiconductor device, i.e., a vertical power MOSFET.

Next, source contacts are provided to source regions 144. Source contacts 148 shown in FIG. 14 could be made, again without resort to lithographic techniques, by anodizing gates 136 to form insulating layers 146 followed by deposition of a metal such as chromium, platinum, gold, aluminum, nickel or gold or alloys thereof by means such as sputtering. Metal sputtered onto the surfaces of insulating layer 146 situated over gates 136 may be removed by reverse sputtering or by plasma (dry) etching techniques. Alternatively, source regions 144 may be contacted by extending regions 144 beyond the area or perimeter of the active device to form so-called diffusion lines and making the ohmic contacts with the diffusion lines by conventional lithographic processes at "remote" locations beyond the perimeter.

Lastly, at least one metallized drain contact 148 is provided to backside surface 108 of body 102. This step may suitably be accomplished by such means as planar magnetron sputter deposition of such materials as titanium-silver. The completed device of FIG. 14 and similar such semiconductor devices made by the method of this invention, offers the advantages of high gate packing density and large device areas which, in turn, result in such desirable operating characteristics as low drain-to-source resistance, made possible by the use of the thin film lamellar metallic eutectic for the gate contacts.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A method for making self aligned doped regions in a body of semiconductor material comprising the steps of:
   (a) providing a body of semiconductor material suitable for the manufacture of semiconductor devices, said body having substantially parallel upper and lower major surfaces and a peripheral edge area interconnecting said major surfaces;
   (b) forming a thin film lamellar metallic eutectic on at least a portion of said upper major surface of said body;
   (c) selectively removing one of the lamellar phases of said thin film lamellar metallic eutectic, forming thereby a spaced array of substantially parallel metallic elements of the remaining phase with substantially parallel spaces in-between said elements and exposing thereby segments of said upper major surface beneath the selectively removed phase and in-between said elements; and
   (d) forming at least first doped regions directly beneath the exposed segments of said upper major surface in-between said elements by introducing a first concentration of atoms of a first impurity type through the exposed segments of said upper major surface in-between said elements.

2. The method of claim 1 wherein said forming step comprises introducing said impurity atoms by ion implantation means.

3. The method of claim 2 further including the step of heating said body to a sufficient temperature for a time sufficient to substantially remove from said first doped regions damage caused by said ion implantation.

4. The method of claim 1 further including the step of diffusing said atoms of a first impurity type to form first extended doped regions, said first extended doped regions underlying said upper surface and extending between at least a portion of said metallic elements on either side of each said exposed segment of said upper major surface.

5. The method of claim 4 further including the step of forming at least second doped regions directly beneath the exposed segments of said upper major surface in-between said elements by introducing a second concentration of atoms of a second impurity type through the exposed segments of said upper major surface in-between said elements, said second doped region being substantially bounded by said segments of said upper major surface and said first extended doped regions.

6. The method of claim 5 further including the step of diffusing said atoms of a second impurity type to form second extended doped regions, said second extended doped regions underlying and extending between at least a portion of said metallic elements on either side of each said exposed segment of said upper major surface, said second extended doped regions being substantially bounded by said upper major surface and said first extended doped regions.

7. The method of claim 1 wherein said step of forming at least first doped regions comprises introducing said atoms of a first impurity type by diffusion from an impurity source and wherein said atoms of a first impurity type are diffused substanially simultaneously to form first extended doped regions, said first extended doped regions underlying said upper surface and extending between at least a portion of said metallic elements on either said of each said exposed segment of said upper major surface.

8. The method of claim 7 further including the steps of introducing atoms of at least a second impurity type by diffusion from an impurity source through the exposed segments of said upper major surface in-between said elements and substantially simultaneously diffusing said atoms of a second impurity type to form at least second extended doped regions, said second extended doped regions underlying and extending between at least a portion of said metallic elements on either side of each said exposed segment of said upper major surface, said second extended doped regions being substantially bounded by said upper major surface and said first extended doped regions.

9. The method of claim 1 wherein said thin film lamellar metallic eutectic is a eutectic selected from the group consisting of the lead-tin, lead-cadmium, aluminum-copper, chromium-silicon and molybdenum-silicon eutectic systems.

10. The method of claim 1 wherein said thin film lamellar metallic eutectic is the Al-CuAl$_2$ eutectic of the aluminum-copper system and the interlamellar spacing, $\lambda$, is described by the equation:

$$\lambda = B(V)^{-\frac{1}{2}}$$

wherein $B = 8.4 \times 10^{-6}$ cm$^{3/2}$sec$^{-\frac{1}{2}}$ and V, the solidification velocity ranges from about $1 \times 10^{-3}$ to about 1.0 cm/sec.

11. The method of claim 1 wherein said thin film lamellar metallic eutectic is the eutectic of the lead-cadmium eutectic system.

12. The method of claim 11 wherein the widths of the lead-rich lamellae are about 0.42 micron and the interlamellar spacing is about 0.57 micron.

13. The method of claim 1 wherein the widths of the metallic elements of said spaced array and the spaces in-between said metallic element are less than or equal to about one micron.

14. The method of claim 1 wherein said body of semiconductor material is inhomogeneously doped.

15. A method for making semiconductor devices comprising the steps of:
(a) providing a substrate suitable for the manufacture of semiconductor devices, said substrate including at least a planar base of a semiconductor material and a planar layer of a dielectric and insulating material, said base having substantially parallel upper and lower major planar surfaces and a peripheral edge area interconnecting said major surfaces, said planar layer of a dielectric and insulating material being situated on and contiguous with at least a portion of said upper major planar surface of said base;
(b) forming a thin film lamellar metallic eutectic on said planar layer of a dielectric and insulating material;
(c) selectively removing one of the phases of said thin film lamellar metallic eutectic forming thereby an array of spaced metallic elements of the remaining phase with substantially parallel spaces in-between said elements and exposing thereby segments of said planar layer of a dielectric and insulating material beneath the selectively removed phase and between said spaced metallic elements of said array;
(d) removing the exposed segments of said planar layer of a dielectric and insulating material from in-between said spaced metallic elements of said array forming thereby an array of substantially parallel metallic gate contacts and exposing thereby segments of said upper major surface of said base beneath the removed exposed segments of said planar layer of a dielectric and insulating material and in-between said gate contacts;
(e) forming first extended doped regions and second extended doped source regions, said extended doped regions underlying and extending between at least a portion of said gate contacts on either side of each said exposed segment of said upper major surface of said base, each said second extended doped source region being substantially bounded by said upper major surface of said base and by a first extended doped region;
(f) providing source contacts to said source regions; and
(g) providing at least one drain contact on said lower major planar surface of said body.

16. The method of claim 15 wherein said planar layer of a dielectric and insulating material is a thermally grown oxide of the semiconductor material of said base.

17. The method of claim 15 wherein the semiconductor material of said base is silicon having a first conductivity type.

18. The method of claim 17 wherein said first extended doped region has a conductivity type opposite to that of said base.

19. The method of claim 18 wherein said second extended doped region has a conductivity type opposite to that of said first extended doped region.

20. The method of claim 14 wherein said base of semiconductor material is inhomogeneously doped.

21. The method of claim 15 wherein said thin film lamellar metallic eutectic is a eutectic selected from the group consisting of the lead-tin, lead-cadmium, aluminum-copper, chromium-silicon and molybdenum-silicon eutectic systems.

22. The method of claim 15 wherein said thin film lamellar metallic eutectic is the Al-CuAl$_2$ eutectic of the aluminum copper system and the interlamellar spacing, $\lambda$, is described by the equation:

$$\lambda = B(V)^{-\frac{1}{2}}$$

wherein $B = 8.4 \times 10^{-6}$ cm$^{3/2}$sec$^{-\frac{1}{2}}$ and V, the solidification velocity ranges from about $1 \times 10^{-3}$ to about 1.0 cm/sec.

23. The method of claim 15 wherein said thin film lamellar metallic eutectic is the eutectic of the lead-cadmium eutectic system.

24. The method of claim 23 wherein the widths of the lead-rich lamellae are about 0.42 micron and the interlamellar spacing is about 0.57 micron.

25. The method of claim 15 wherein the widths of the metallic elements of said spaced array and the spaces in-between said metallic elements are less than or equal to about one micron.

* * * * *